United States Patent [19]

Hallford

[11] 4,330,868
[45] May 18, 1982

[54] BALUN COUPLED MICROWAVE FREQUENCY CONVERTER

[75] Inventor: Ben R. Hallford, Wylie, Tex.

[73] Assignee: Rockwell International Corp., El Segundo, Calif.

[21] Appl. No.: 216,872

[22] Filed: Dec. 15, 1980

[51] Int. Cl.³ .......................... H04B 1/26; H03H 7/42
[52] U.S. Cl. ..................................... 455/327; 333/26
[58] Field of Search ............... 455/323, 325, 326, 327, 455/330, 331; 330/4.5, 4.9; 307/424; 332/43 B, 44, 47, 52; 333/26

[56] References Cited

U.S. PATENT DOCUMENTS

| | | | |
|---|---|---|---|
| 2,834,876 | 5/1958 | Pritchard et al. | 250/20 |
| 3,652,941 | 3/1972 | Neuf | 325/446 |
| 3,678,433 | 7/1972 | Hallford | 333/73 |
| 3,681,697 | 8/1972 | Moroney | 325/446 |
| 3,772,599 | 11/1973 | Ernst et al. | 325/446 |
| 3,831,097 | 8/1974 | Neuf | 325/446 |
| 4,245,356 | 1/1981 | Hallford | 455/327 |

OTHER PUBLICATIONS

Ben R. Hallford, "Trace Phase States to Check Mixer Designs", *Microwaves*, Jun. 1980, pp. 52–60.
L. E. Dickens and D. W. Maki, "A New 'Phase-Typed' Image Enhanced Mixer", 1975, IEEE MTT Symposium, pp. 149–151.
Julius Lange, "Interdigitated Strip-Line Quadrature Hybrid", 1969, *International Microwave Symposium*, Dallas, TX, May 5–7, IEEE Cat. No. 69C 6, pp. 10–13.

*Primary Examiner*—Marc E. Bookbinder
*Attorney, Agent, or Firm*—V. Lawrence Sewell; Howard R. Greenberg; H. Fredrick Hamann

[57] ABSTRACT

A microwave frequency converter is provided by a single mixer of the diode-quad bridge type which circulates generated image frequency within the bridge. The bridge is connected between balun coupled RF microstrip conductors and unbalanced LO microstrip conductors. There is zero connection length between the diode pairs to reduce conversion loss by preventing a phase shift between the image frequencies. Mutual isolation is provided between the RF, LO and IF signals over a broad frequency range. In an alternate utilization, the converter accepts transposed RF and LO signals, for broader bandwidth operation. The circuit may also be implemented as an up converter.

45 Claims, 8 Drawing Figures

BALUN COUPLED MICROWAVE FREQUENCY CONVERTER

TECHNICAL FIELD

The invention relates to microwave diode mixers and associated circuitry for up and down conversion between high frequency signals (e.g., RF or LO in the 6 GHz range) and low frequency signals (e.g., IF in the 70 MHz range).

BACKGROUND

Microwave diode mixers are well known in the art. In a down converter, the mixer has an input port for receiving an RF signal and an input port for receiving a local oscillator (LO) signal. The mixer has an output port delivering a plurality of frequencies, including an IF signal at a frequency which is the difference between the RF and LO signal frequencies. The frequencies which are output from the mixer are the modulation products which exist according to the heterodyne principle by which the mixer operates, wherein an RF signal and an LO signal are applied to a nonlinear element such as a diode.

In an up converter, the mixer has an input port for receiving an LO signal and an input port for receiving an IF signal. The mixer has an output port for delivering a plurality of frequencies, including RF signals which are the sum and difference of the LO and IF signal frequencies. The frequencies which are output from an up converter mixer are likewise the modulation products which exist according to the heterodyne principle by which the mixer operates.

A double balanced diode mixer has two pairs of diodes either cross connected (lattice modulator) or connected in a loop (ring modulator), which are equivalent. The individual diodes in each pair are commonly poled, and the composite pairs may be commonly or oppositely poled.

In addition to the IF signal, a down converter mixer generates a signal which is the image of the RF signal but on the opposite frequency side of the LO signal AS an example, a mixer receiving a 6 GHz (6,000 MHz) input RF signal and a 5,930 MHz input LO signal would generate a 70 MHz IF signal and a 5,860 MHz image RF signal. About half of the incoming RF power is used in generating this image frequency signal. The loss in converting an incoming RF signal to an IF signal is thus significantly increased by this image frequency generation. Likewise for up conversion, conversion loss is caused by frequency generation of an unused sideband. For further background regarding mixer operation, reference is made to my article entitled "Trace Phase States to Check Mixer Designs", *Microwaves*, June 1980, pages 52–60.

Prior art devices have eliminated the image frequency signal in a variety of ways. Some devices use filters to prevent the image frequency signal from entering the input signal circuitry, but this still results in an energy loss to the system, and also reduced bandwidth. Some devices provide an open or short circuit at the diodes in order to recover, or reduce the loss of, the image frequency energy. U.S. Pat. Nos. 2,834,876 and 3,681,697 show image recovery mixers where the image frequency power is reflected back to the mixer to provide recovery of the image frequency energy. These devices are discussed in U.S. Pat. No. 3,831,097 to Neuf, which shows an image recovery mixer system having two double balanced mixers each of the diode bridge type, one set of opposing diagonals of one bridge being interconnected with one set of opposing diagonals of the other bridge to cancel the image frequency signal directly between the diode mixers.

Another patent to Neuf, U.S. Pat. No. 3,652,941, shows a mixer with a single diode-quad bridge. Each side of the bridge is input from balanced lines referenced to each other, i.e. balanced circuits that don't have a ground reference at the diode terminals are used for both the RF and LO inputs to the mixer. One RF line is on top of a dielectric substrate and the other RF line is on the bottom. The balanced LO lines are likewise juxtaposed on opposite sides of the substrate.

Other mixer circuits with a single diode-quad mixer bridge are shown in a paper entitled "A New 'Phase-Typed' Image Enhanced Mixer", by L. E. Dickens and D. W. Maki, 1975 *IEEE MTT Symposium*, pp. 149–151, and in Ernst et al., U.S. Pat. No. 3,772,599. The mixer is formed by two pairs of diodes providing a bridge across a slot transmission line. While these mixers have proved useful for their intended purpose, they suffer the inherent disadvantages and undesirable characteristics of slot line circuits, including the various constraints on the dimensions of the slot, minimum ground plane spacing on either side of the slot, the requisite high dielectric constant substrate, transmission mode waveguide problems, etc. The width of the slot should usually be no greater than 5 to 10 mils. A dielectric substrate having a high magnitude of relative dielectric constant of 9 to 10 or greater is needed. If the slot line is to be generally useful as a transmission line, the fields must be closely confined to the slot. Close confinement can be achieved with slots of realistic dimensions by using a fairly high dielectric constant substrate. If the guide wavelength is roughly 30 to 40 percent of the free space wavelength, the fields will be adequately confined. Low dielectric constant substrates, for example less than about 8, are typically not suitable for slot line application because the energy is not well confined to the slot. A further drawback is that specialized and expensive fabrication techniques are required, such as a thin film operation depositing gold on ceramic.

SUMMARY

The present invention provides an improved microwave frequency converter. A single mixer of the diode-quad bridge type is provided and affords microwave frequency conversion without the undesirable characteristics of slot line transmission. The RF port to the bridge is balanced, and the LO port to the bridge is unbalanced.

The mixer is provided by two pairs of diodes forming a bridge between first and second balanced RF conductors and first and second unbalanced LO conductors. The first and second RF conductors are coplanar and extend from a ground plane toward a common area. An RF strip transmission line is juxtaposed the RF conductors and interactingly couples a field balanced between the first and second RF conductors across the common area. The LO conductors are coplanar and adjacent the common area. The two pairs of diodes interconnect the first and second RF and LO conductors.

The diode bridge is connected to the RF conductors at a single point on each to provide zero connection length between the diode pairs. The image frequency signals generated in the two diode pairs circulate in the diode quad only and are 180 degrees out of phase with each other because of single point connection between the diode pairs. This gives a net voltage of zero for the generated image frequencies and returns the image frequency power to the diodes to reduce conversion loss.

The invention affords mutual isolation between the RF, LO and IF signals over a broad frequency range. The circuit is compact and capable of a large operating frequency bandwidth.

In an alternate utilization desirable for certain applications, the circuit accepts transposed RF and LO inputs, providing even wider bandwidth operation, but also higher conversion loss.

In a particularly desirable aspect of the invention, standard printed circuit board techniques may be used for fabrication, resulting in significant cost reduction.

DETAILED DESCRIPTION

Figure 1:
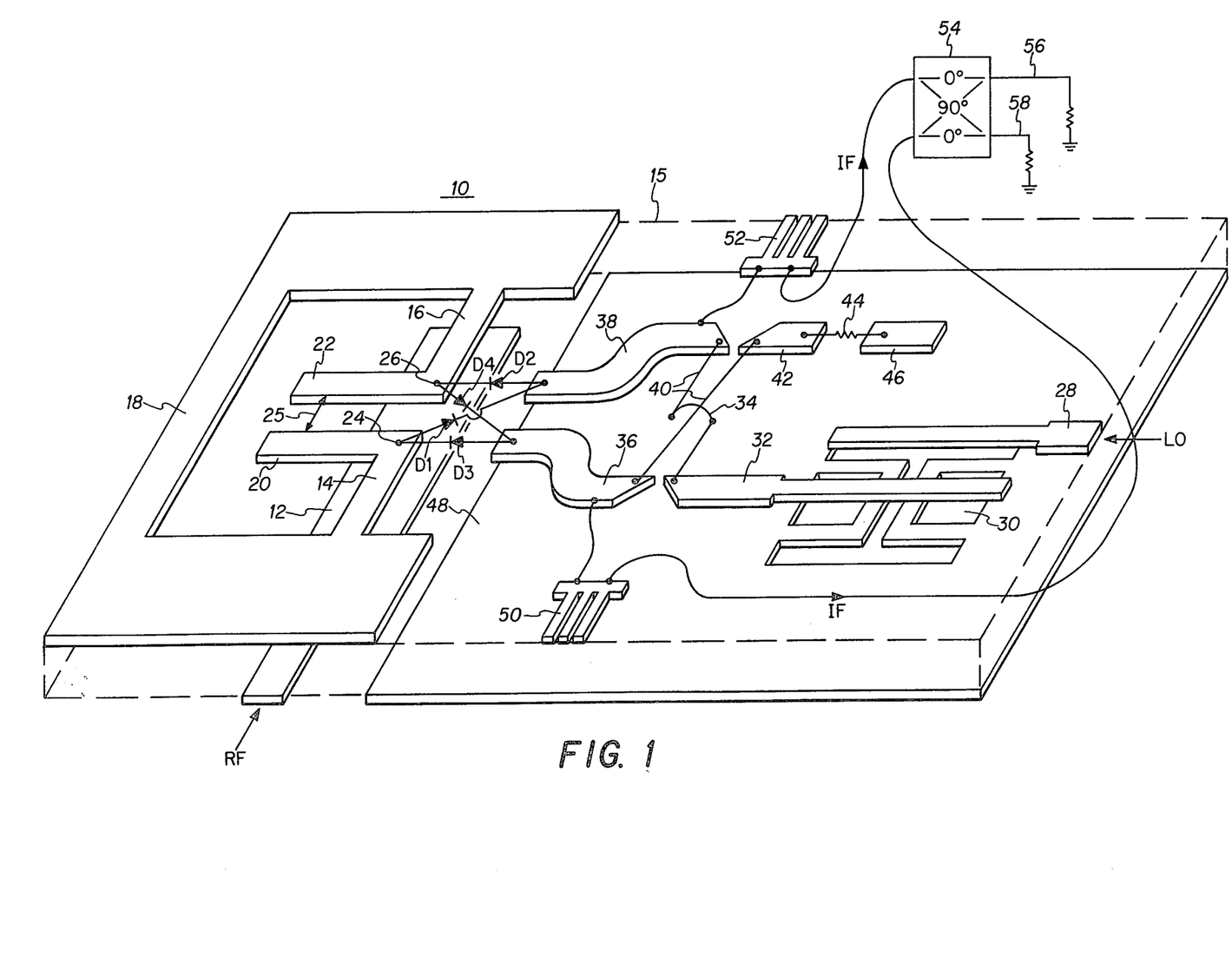
FIG. 1 is an isometric illustration of the microstrip circuit layout of a converter constructed in accordance with the invention.

FIG. 1 shows a balun coupled microwave frequency converter 10 constructed in accordance with the invention. For down conversion, transmission path 12 receives an RF signal and couples it to conductors 14 and 16 from which transmission path 12 is spaced by a dielectric material substrate 15. This substrate may have a relative dielectric constant as low as of 1 to 2. Conductors 14 and 16 are connected to a U-shaped ground plane 18. Conductors 14 and 16 extend inwardly from the ground plane towards each other and each have a length of one-quarter of the wavelength of the RF frequency. A pair of stubs 20 and 22 extend parallel to each other and perpendicular from and integral with a respective one of the conductors 14 and 16. Stubs 20 and 22 have a length of one-quarter wavelength of the RF frequency and are not connected at their ends to ground plane 18, but rather are open-circuited.

Conductor 14 and stub 20 meet at junction point 24, and conductor 16 and stub 22 meet at junction point 26. The field coupled from transmission path 12 is created across the gap 25 between balanced junction points 24 and 26. The width of gap 25 is approximately 40 mils. First and second RF conductors 14 and 16 thus extend from the ground plane toward a common area. Input RF signal transmission line 12 is juxtaposed conductors 14 and 16 for interacting therewith to generate a field across the common area and provide the balun couple.

Transmission path 28 receives the local oscillator (LO) or carrier frequency signal. The LO signal on transmission path 28 is coupled through a bandpass filter or signal isolator 30 to a conductor 32. Filter 30 passes signals in the LO frequency range from transmission path 28 to conductor 32. In the reverse direction, filter 30 blocks signals in the IF frequency range from being transmitted from conductor 32 to transmission path 28 and thus provides IF isolation. These types of filters are known in the art. In the preferred embodiment, a balun filter like that shown in my U.S. Pat. application Ser. No. 084,287, filed Oct. 12, 1979, entitled "Balun Filter Apparatus", is used for filter 30 because it presents high isolation impedance to IF and hence an effective open-circuit to IF.

The LO signal on conductor 32 is coupled through a 90 degree quadrature hybrid 3 dB coupler 34 to conductors 36 and 38 such that the LO signals appearing on these conductors are 90 degrees out of phase with each other. These types of hybrid couplers are known in the art, for example as shown in said U.S. Pat. No. 3,831,097, Neuf. Hybrid coupler 34 preferably includes a plurality of interdigitated strip lines 40, for example as described in "Interdigitated Strip-Line Quadrature Hybrid", Julius Lange, 1969 *International Microwave Symposium*, Dallas, Tex., May 5–7, IEEE Cat. No. 69 c 6, pp. 10–13. A conductor 42 is provided with a resistor 44 to an open circuited stub 46 which has a length of one-quarter wavelength of the RF frequency. This arrangement provides an impedance match for RF signals, and provides a substantially infinite impedance to IF signals to appear as an open-circuit to the latter.

Conductor 36 is unbalanced, with the field therearound being coupled to ground plane 48, which is spaced from conductor 36 by the dielectric substrate 15. Conductor 38 is likewise unbalanced, with a ground reference to ground plane 48.

In FIG. 1, conductor 12 and ground plane 48 are coplanar and are on the bottom-side of substrate 15. Conductors 28, 32, 36, 38, 42, 46, 14, 20, 16, 22 and ground plane 18 are all coplanar and are on the top-side of substrate 15. In an alternative embodiment, conductor 12 is on the top-side of substrate 15; and conductors 14, 20, 16 and 22 are on the bottom-side of substrate 15, with ground plane 18 also on the bottom-side of substrate 15 and continuous with ground plane 48.

A diode bridge is formed by four diodes D1, D2, D3 and D4, and is connected between RF conductor points 24 and 26 and LO conductors 36 and 38. The LO and RF signals are mixed in the diodes to generate the various modulated frequencies, including an IF signal on conductors 36 and 38. A pair of IF bandpass filters 50 and 52 are on the top-side of substrate 15 and are connected to the conductors 36 and 38. These filters are connected to a 90 degree quadrature hybrid 3 dB coupler 54 having a pair of outputs 56 and 58 for the upper and lower sidebands. Filters 50 and 52 are RF suppression filters rejecting RF signals but allowing IF signals to pass therethrough, an example of which is described in my U.S. Pat. No. 3,678,433. Hybrid coupler 54 may be like that shown in said U.S. Pat. No. 3,831,097, Neuf.

Figure 2:
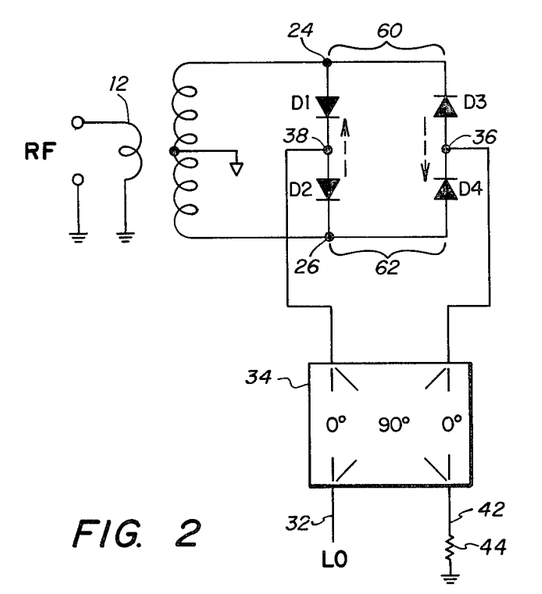
FIG. 2 is a circuit diagram of the converter of FIG. 1.

FIG. 2 shows the equivalent circuit. While FIG. 1 shows the diode-quad in a cross-connected configuration, FIG. 2 shows the diode-quad in a ring configuration to facilitate clarity in the following description. The configurations are electrically equivalent.

Referring to FIG. 2, the generated image frequency is shown by the dashed arrows. The image frequency phase is equal in diodes D1 and D2 so that they combine for this diode pair. The image frequency phase is equal in diodes D3 and D4 so that they combine for this diode pair. The summed image frequency in diode pair D1, D2 is 180 degrees out of phase with the summed image frequency in diode pair D3, D4. This gives a net zero voltage for the generated image frequencies. The image frequency power is therefore returned to the diodes to reduce the conversion loss.

Diodes D1 and D3 are connected to single common junction point 24, and hence the length of connection 60, FIG. 2, is zero. Likewise, diodes D4 and D2 are connected to the same junction point 26, and hence the length of connection 62 is zero. These zero connection lengths are important because they provide precise 180 degree phase differentials between the image frequency phase in diode pair D1, D2 and the image frequency phase in diode pair D3, D4.

As seen in FIG. 2, the image frequency current circulates in the diode-quad. If the connection lengths 60 and 62 are not zero, then the traversal distance for the image current would cause a phase shift. The image frequency phase in diode pair D1, D2 would be other than 180 degrees out of phase with the image frequency phase in diode pair D3, D4. This would reduce the conversion efficiency because of uncancelled image frequency power. The net voltage of the recovered image frequencies would not be zero because of the non-180 degree phase differential.

In the present invention, the connection length 60 is zero because of the single connection point 24, and the connection length 62 is zero because of the single connection point 26. The image frequencies in the diodes pairs are thus 180 degrees out of phase, giving a net voltage of zero for the generated image frequencies, whereby to reduce the conversion loss.

The invention provides mutual isolation between the RF, LO and IF signals. The LO signal on conductor 38 is isolated from conductor 36 because of the low impedance, effective ground provided by junction point 26 due to one-quarter wavelength open stub 22, and because of the low impedance, effective ground provided by junction point 24 due to one-quarter wavelength open stub 20. One LO signal path from conductor 38 to conductor 36 is through diodes D2 and D4; however the junction point therebetween is the effective ground point 26 and hence the LO signal may flow from conductor 38 through diode D2 but is isolated from conductor 36. The other LO signal path from conductor 38 to conductor 36 is through diodes D1 and D3; however the junction point therebetween is the effective ground point 24 and hence the LO signal may flow from conductor 38 through diode D1 but is isolated from conductor 36. Likewise, the LO signal on conductor 36 is isolated from conductor 38 because of the low impedance, effective ground points 24 and 26.

The RF signal on balanced junction points 24 and 26 due to the induced field therebetween is isolated from conductors 36 and 38. The RF signal from junction point 24 flows through diode D1 and then diode D2 to junction point 26. Since RF conductor points 24 and 26 are balanced, they are each other's reference points, and hence the voltage on junction point 24 is referenced to junction point 26, not to ground as is the voltage on unbalanced conductor 38. The RF signal from junction point 24 flows through diode D1 toward conductor 38 and through diode D2 away from conductor 38 such that conductor 38 sees opposite polarities (voltages which are 180 degrees out of phase), and hence no net voltage is induced on conductor 38. The RF signal between junction points 24 and 26 is likewise isolated from conductor 36.

The LO signals on conductors 36 and 38 are isolated from the RF signal between RF conductor points 24 and 26. The LO signal on conductor 38 sees a low impedance, effective ground at each of points 24 and 26, whereby to add the same effective voltage to each in parallel, resulting in no change of the net voltage difference between points 24 and 26. The LO signal on conductor 36 is likewise isolated from the RF signal between points 24 and 26.

Figure 3:
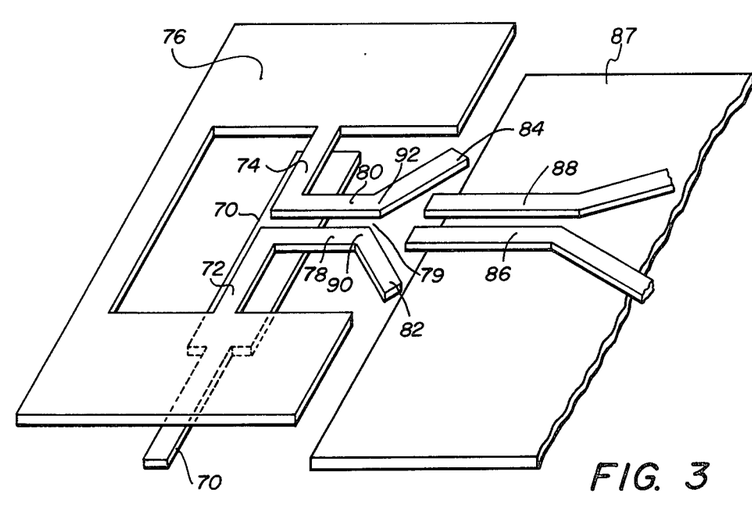
FIG. 3 is an isometric illustration of an alternate embodiment of a portion of the microstrip circuit layout of FIG. 1.

FIG. 3 shows an alternate configuration of the RF conductor microstrip pattern. RF transmission line 70, which corresponds to transmission line 12 of FIG. 1, couples the RF signal to coplanar RF conductors 72 and 74, corresponding to conductors 14 and 16 of FIG. 1. RF transmission line 70 extends beneath ground plane 76 and RF conductors 72 and 74, and is spaced therefrom by a substrate (not shown) of low relative dielectric constant of 2 to 5. RF conductors 72 and 74 extend from ground plane 76 towards a common area and have extensions 78 and 80 between which the induced RF field exists. The width of gap 79 between these extensions is about 40 mils. Extensions 78 and 80 have one-quarter wavelength open-circuited phase-inversion stubs 82 and 84, corresponding to stubs 20 and 22 of FIG. 1.

Coplanar LO conductors 86 and 88, corresponding to LO conductors 36 and 38 of FIG. 1, are connected to RF conductor points 90 and 92, corresponding to points 24 and 26 in FIG. 1, by a diode-quad bridge as in FIG. 1. LO conductors 86 and 88 are each unbalanced, with a ground reference to a ground plane 87 therebelow comparable to ground plane 48 of FIG. 1. The field around conductor 86 is thus coupled to a ground plane, not to conductor 88; the field around conductor 88 is likewise coupled to the ground plane. The LO input to the diode-quad bridge is thus unbalanced.

RF conductors 72 and 74, and their extensions 78 and 80, are balanced, with the fields around each being coupled to each other, not to a ground plane. The diode bridge thus has a balanced RF input and an unbalanced LO input, as in FIG. 1.

The generated image current circulates only in the diode-quad, as in FIG. 1, and RF conductor points 90 and 92 each provides the single common point zero length connection between the diode pairs to prevent a phase shift between the generated image frequencies and thus provide a precise 180 degree phase differential therebetween giving a net image voltage of zero.

Figure 4:
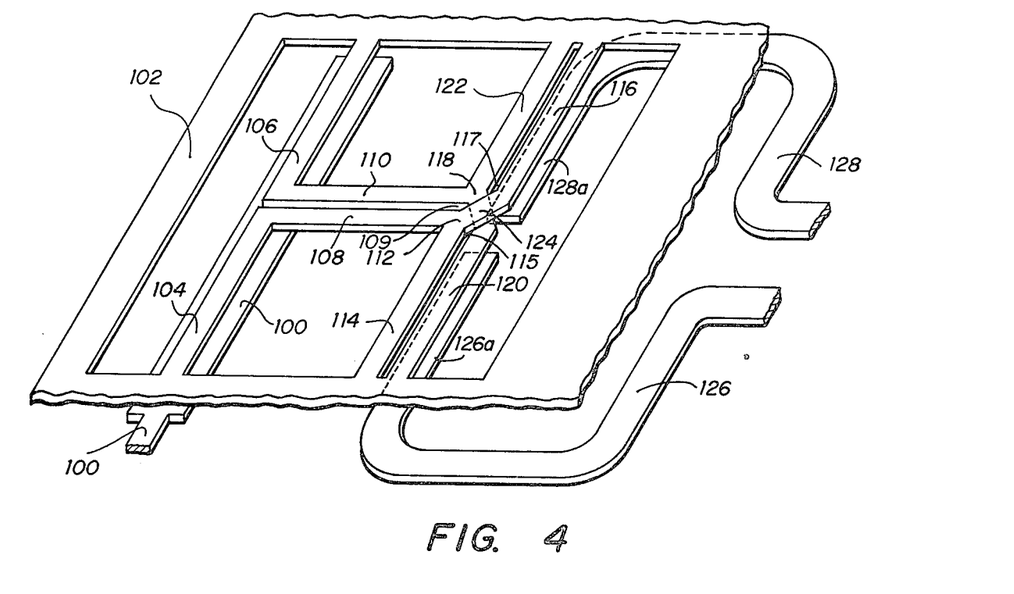
FIG. 4 is an isometric illustration of another alternate embodiment of a portion of the microstrip circuit layout of FIG. 1.

FIG. 4 shows another alternative for the RF conductor microstrip pattern. RF transmission line 100 extends beneath ground plane 102 and RF conductors 104 and 106, and is spaced therefrom by a dielectric material substrate (not shown) of low relative dielectric constant of 2 to 5. Transmission line 100 couples the RF signal to coplanar RF conductors 104 and 106 to create a field balanced therebetween along the gap 109 between extensions 108 and 110. The width of gap 109 is approximately 40 mils. At the end point 112 of extension 108, a pair of stubs 114 and 116 extend oppositely to meet ground plane 102. Likewise at the end point 118 of extension 110, a pair of stubs 120 and 122 extend oppositely to meet ground plane 102. Stub 116 has a jumper 124, FIG. 5, which extends over and is spaced from stub 120, such that points 112 and 118 are not connected to each other. There is a gap 117 between stubs 116 and 122, and a gap 115 between stubs 120 and 114, each of which has a width comparable to the width of the gap 109.

Coplanar LO conductors 126 and 128 have portions 126a and 128a extending below ground plane 102 and spaced therefrom by the dielectric substrate (not shown). LO conductor portions 126a and 128a extend towards each other and the common area adjacent RF conductor points 112 and 118, as shown in greater detail in FIG. 5. LO conductor portion 126a extends beneath stubs 114 and 120 and has a diode connection point 126b at its end. LO conductor portion 128a extends stubs 116 and 122 and has a diode connection point 128b at its end.

Figure 5:
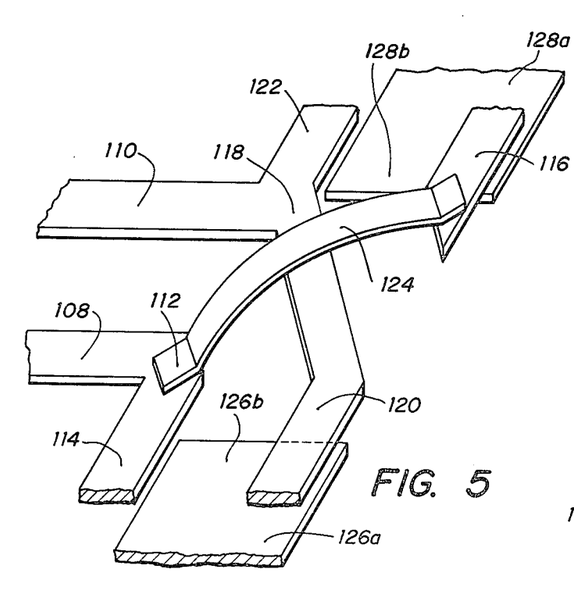
FIG. 5 is an enlargement of a portion of FIG. 4 showing greater detail.
Figure 6:
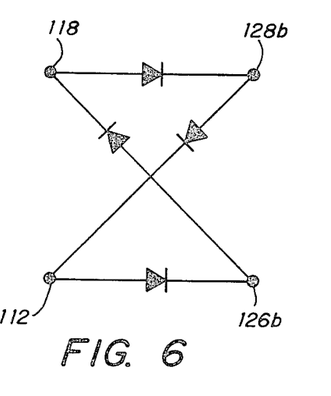
FIG. 6 shows the diode bridge connection for FIG. 5.

The diode bridge is connected between points 118, 128b, 112 and 126b as shown in FIG. 6. RF conductors 108 and 110 are on the top-side of the substrate, and LO conductors 126a and 128a are on the bottom-side of the substrate, whereby the RF conductors are not coplanar with the LO conductors as in FIGS. 1 and 3. In the embodiment of FIGS. 4 and 5, ohmic leads extend from points 112 and 118 down through the substrate and the diode bridge is connected on the bottom-side of the substrate.

As before, the RF input to the bridge is balanced and the LO input is unbalanced. Image current circulates in the diode-quad only, to return the image frequency power to the diodes. RF conductor points 118 and 112 provide single common zero connection length points for the diode pairs, to thus provide a precise 180 degree phase differential therebetween for generated image frequency, and a net image voltage of zero, thus reducing conversion loss.

The arrangement in FIG. 4 provides mutual isolation of the signals. LO signals on LO conductor portion 128a are isolated from LO conductor portion 126a because point 128b sees effective grounds at points 112 and 118 due to the effective ground plane provided by stubs 114 and 116, and by stubs 120 and 122. LO signals on LO conductor portion 126a are likewise isolated from LO conductor portion 128a because point 126b sees effective grounds at points 118 and 112 due to stubs 120 and 122, and stubs 114 and 116. LO signals on LO conductor portion 128a are isolated from the RF field between RF conductor points 118 and 112 because conductor portion 128a sees equal reference levels thereat due to stubs 116 and 122 along which conductor portion 128a extends in closely spaced parallel relation. LO signals on LO conductor portion 126a are likewise isolated from the RF field between RF conductor points 118 and 112 because LO signals on conductor portion 126a see equal potential drops to the same reference levels on stubs 114 and 120, and hence there is no change in the net difference in potential between RF conductor points 112 and 118. The RF signal between RF conductor points 112 and 118 is isolated from the LO conductor 128a because the field across points 118 and 112 induces one polarity from one end of the field and the opposite polarity from the other end across the interconnecting diodes and thus cancel at 128b. The RF signal is likewise isolated from LO conductor 126a.

Figure 7:
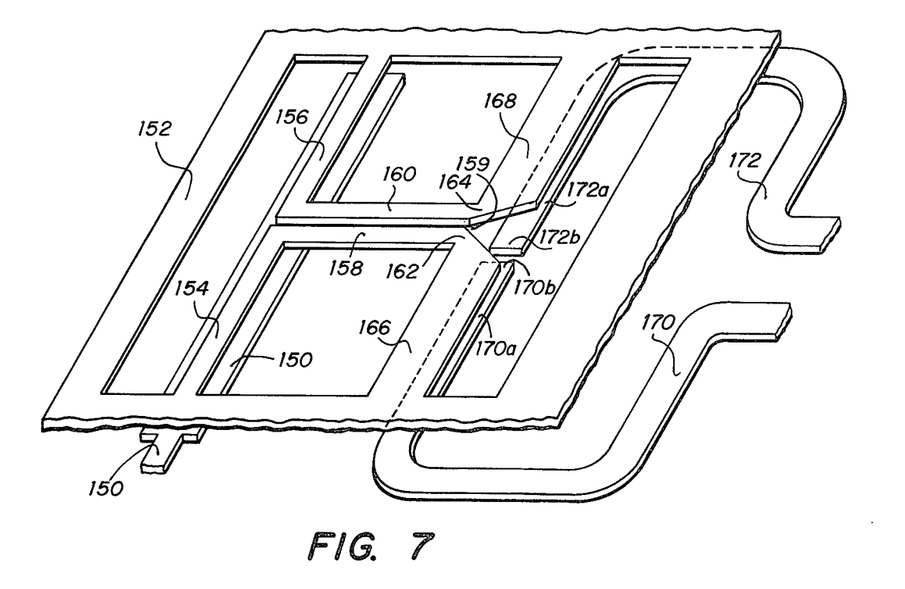
FIG. 7 is an isometric illustration of another alternate embodiment of a portion of the microstrip circuit layout of FIG. 1.

FIG. 7 shows another alternative RF conductor microstrip pattern. RF transmission line 150 extends beneath ground plane 152 to couple the RF signal to balanced, coplanar RF conductors 154 and 156 and is spaced therefrom by a dielectric material substrate (not shown) of low relative dielectric constant of 2 to 5. The induced field between balanced conductors 154 and 156 exists across the common gap area therebetween along extensions 158 and 160 to points 162 and 164. The width of gap 159 is about 40 mils. RF conductor point 162 has a wide stub 166 tapered at its root end and extending to the ground plane 152. RF conductor point 164 has a wide stub 168 tapered at its root end and extending to the ground plane 152.

Unbalanced, coplanar LO conductors 170 and 172 have portions 170a and 172a spaced beneath ground plane 152 by the dielectric substrate (not shown) and extending toward the common area adjacent RF conductor points 162 and 164. The ends of LO conductor portions 170a and 172a are spaced and have diode connection points 170b and 172b for diode interconnection with RF conductor points 162 and 164, comparably to FIG. 6. Again, image frequency power is returned to the diodes, and zero connection length is provided between the diode pairs by single point connections 162 and 164. Wide stubs 166 and 168 appear to be effective grounds and equal reference levels to the LO signals in lines 172a and 170a.

Figure 8:
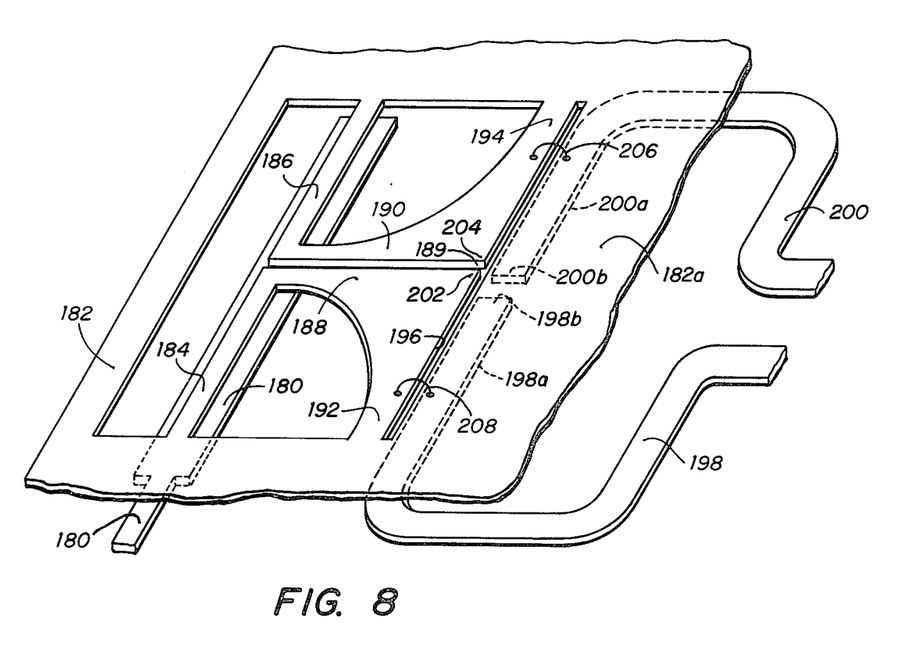
FIG. 8 is an isometric illustration of another alternate embodiment of a portion of the microstrip circuit layout of FIG. 1.

FIG. 8 shows a further alternative for the RF conductor microstrip pattern. RF transmission line 180 extends beneath ground plane 182 and is spaced therefrom by a dielectric material substrate (not shown) of low relative dielectric constant of 2 to 5. RF transmission line 180 couples the RF signal to balanced, coplanar RF conductors 184 and 186 to create a field across the common gap area therebetween along extensions 188 and 190. The width of gap 189 is about 40 mils. These extensions are flared into stubs 192 and 194 connected to ground plane 182. A gap 196 is formed between these stubs and the remainder of the ground plane designated 182a. Unbalanced, coplanar LO conductors 198 and 200 have portions 198a and 200a extending beneath the ground plane and separated therefrom by the dielectric substrate (not shown). LO conductor portions 198a and 200a extend toward each other beneath gap 196 to the common area adjacent RF conductor points 202 and 204. The ends of LO conductor portions 198a and 200a have diode connection points 198b and 200b for interconnection of a diode-quad to RF conductor points 202 and 204, as in FIG. 6. As above, image frequency power is returned to the diodes, and zero connection length between the diode pairs is provided by RF conductor points 202 and 204. A jumper strap 206 is provided across gap 196 between stub 194 and ground plane portion 182a to set these two sides of the gap at the same reference level such that the LO signal on conductor portion 200a sees an effective ground for isolation purposes. The jumper 208 is comparable.

Each of the microwave circuits described above is fabricated using standard printed circuit board techniques. A simple off-the-shelf dielectric substrate which is copper clad on both sides is used. The copper is merely etched away to yield the microstrip patterns shown.

Though not a constraint of the invention, the above noted parameters are significant, particularly the gap-width and dielectric constant. The invention enables microstrip transmission on the substrate as opposed to slot line transmission. While a high dielectric constant substrate may of course be used, the use of a low dielectric constant substrate is enabled by the invention, and is preferred in order to reduce cost.

An alternative application of the invention is to transpose the RF and LO inputs such that, referring to FIG. 2, the received signal (RF) is applied to 90 degree hybrid coupler 34 and the high power signal (LO) is applied to input 12. The diode bridge still has both a balanced input (LO) and an unbalanced input (RF). This application may be desirable where an input RF amplifier is used and extremely low conversion loss is not of paramount importance, but rather a broader bandwidth is desired. This application has a higher conversion loss because the image frequency power is returned to load 44.

As noted in my above referenced article "Trace Phase States to Check Mixer Designs", page 52, equation (1):

$$\phi_I = 2\phi_{LO} - \phi_{RF}$$

where $\phi_I$ is the relative phase of the generated image signal, $\phi_{LO}$ is the relative phase of the LO signal, and $\phi_{RF}$ is the relative phase of the RF signal. If minimum conversion loss is desired, then the RF signal is applied to input 12 and the LO signal is applied to 90 degree hybrid 34, FIG. 2. In this application it is seen that, taking zero as a reference phase point, $\phi_{RF}$ through diodes D1 and D2 will be zero and $\phi_{RF}$ through diodes D3 and D4 will also be zero because of their single common connection point 24. Taking the output from hybrid 34 to point 38 as zero and the other output to point 36 as −90 degrees, it is seen that $\phi_{LO}$ through diodes D1 and D2 is zero and $\phi_{LO}$ through diodes D3 and D4 is −90 degrees. It is thus seen that for diodes D1 and D2, $\phi_I=2(0°)-0°=0°$. For diodes D3 and D4, $\phi_I=2(-90°)-0°=-180°$. $\phi_I$ for diodes D1, D2 and for diodes D3, D4 are thus 180 degrees out of phase and cancel when the RF signal is applied to input 12 and the LO signal is applied to input 32.

In the alternative application with the LO signal applied to input 12 and the RF signal applied to 90 degree hybrid coupler 34, $\phi_I$ for diodes D1, D2 and $\phi_I$ for diodes D3, D4 are 90 degrees out of phase with respect to each other and hence do not cancel. Referring to the above equation, $\phi_{LO}$ for diodes D1, D2 is the same as $\phi_{LO}$ for diodes D3, D4 because of single common connection point 24, and zero degrees will be used as a reference point. Assuming the output from hybrid coupler 34 to point 38 is zero degrees and the output from coupler 34 to point 36 is −90 degrees, $\phi_{RF}$ for diode pair D1, D2 is zero degrees and $\phi_{RF}$ for diode pair D3, D4 is −90 degrees. It is thus seen that for diode pair D1, D2, $\phi_I=2(0°)-0°=0°$. For diode pair D3, D4, $\phi_I=2(0°)-(-90°)=90°$. It is thus seen that $\phi_I$ for diode pair D1, D2 is 90 degrees out of phase with $\phi_I$ for diode pair D3, D4, and hence do not cancel. This generated image frequency appears on the now RF line 42, which may be terminated.

In another implementation of the invention, an up converter is provided by applying input IF and LO signals to generate an output RF signal. This provides conversion from low frequency (IF) to high frequency (RF). In FIG. 1, an IF signal is input to lead 56 or 58, and an LO signal is input to conductor 28. The diode-quad mixer bridge mixes the signals and the heterodyne modulation products generated therefrom include an output RF signal between points 24 and 26 which in turn induces an output RF signal on conductor 12. Up conversion in the remaining embodiments is comparable.

It is recognized that various modifications are possible within the scope of the appended claims.

I claim:

1. A balun coupled frequency converter comprising in combination:
   first and second coplanar strip conductors;
   a strip transmission line juxtaposed said first and second strip conductors for interacting therewith to balun couple a field therebetween;
   third and fourth coplanar strip conductors; and
   a diode mixer bridge having two pairs of diodes interconnecting said strip conductors for heterodyne modulation product signal generation.

2. A balun coupled frequency converter having a diode-quad mixer bridge with balanced and unbalanced microstrip conductor ports, comprising in combination:
   first and second balanced strip conductors extending toward a common area;
   an strip transmission line juxtaposed said first and second stripline conductors for interacting therewith to balun couple a field balanced between said first and second strip conductors across said common area;
   third and fourth unbalanced strip conductors adjacent said common area; and
   a diode mixer bridge having two pairs of diodes interconnecting said strip conductors for heterodyne modulation product signal generation.

3. A balun coupled frequency converter comprising in combination:
   ground plane means;
   first and second conductors extending from said ground plane means toward a common area;
   a transmission line juxtaposed said first and second conductors for interacting therewith to balun couple a field balanced between said first and second conductors across said common area;
   third and fourth spaced conductors adjacent said common area; and
   a diode mixer bridge having two pairs of diodes interconnecting said conductors for heterodyne modulation produce signal generation.

4. The invention according to claim 3 wherein said bridge is connected to said first and second conductors at a single point on each to provide zero connection length between the diode pairs.

5. The invention according to claim 4 wherein said third and fourth conductors are each unbalanced.

6. The invention according to claim 5 comprising a first stub extending from said connection point on said first conductor approximately one-quarter of its signal frequency wavelength to an open-circuited end nonconnected to said ground plane means, and a second stub extending from said connection point on said second conductor approximately one-quarter of its signal frequency wavelength to an open-circuited end nonconnected to said ground plane means.

7. The invention according to claim 6 wherein said first and second conductors each have a length of approximately one-quarter signal frequency wavelength between said ground plane means and its respective said connection point, and wherein said first and second stubs extend away from said connection points on the opposite side thereof from said third and fourth connectors.

8. The invention according to claim 6 wherein said first and second stubs diverge from said connection points on the same side thereof as said third and fourth conductors.

9. The invention according to claim 8 wherein said first and second conductors include first portions extending toward each other from said ground plane means and second extension portions extending parallel to each other to meet said first and second stubs at said connection points.

10. The invention acording to claim 5 wherein each of said first and second conductors has a pair of stubs diverging therefrom with the first stub of each pair juxtaposed said third conductor and the second stub of each pair juxtaposed said fourth conductor.

11. The invention according to claim 10 wherein:
said first stubs extend in spaced parallel relation from respective said connection points to said ground plane means;
said second stubs extend oppositely from said first stubs and in spaced parallel relation from respective said connection points to said ground plane means;
one of the stubs has jumper means for crossing over in spaced relation a stub of the other pair to prevent connection therebetween;
said third conductor includes a portion extending in spaced parallel relation with said first stubs and terminating near said connection points; and
said fourth conductor includes a portion extending in spaced parallel relation with said second stubs and terminating near said connection points and spaced from said third conductor.

12. The invention according to claim 5 wherein each of said first and second conductors has a wide stub extending from its said connection point to said ground plane means and juxtaposed a respective one of said third and fourth conductors.

13. The invention according to claim 12 wherein said first and second conductors have first portions extending toward each other from said ground plane means and second extension portions extending parallel to each other to meet said stubs at said connection points, said stubs extending from said connection points to said ground plane means,
and wherein said third conductor includes a portion extending in spaced parallel relation with one of said stubs and terminating near said connection points, and said fourth conductor includes a portion extending in spaced parallel relation with the other of said stubs and terminating near said connection points and spaced from said third conductor.

14. The invention according to claim 13 wherein said stubs extend in opposite directions from said connection points and are divergently tapered at their root ends adjacent to said connection points.

15. The invention according to claim 5 comprising a gap in said ground plane means adjacent said connection points and juxtaposed said third and fourth conductors.

16. The invention according to claim 15 wherein:
said first and second conductors have first portions extending toward each other from said ground plane means and second extension portions extending in spaced parallel relation to said connection points and defining said common area as a gap therebetween;
said gap in said ground plane means diverges from said common area adjacent said connection points to define oppositely extending stubs from respective said connection points to said ground plane means; and
said third conductor includes a portion extending in spaced parallel relation with a section of said gap in said ground plane means and terminating near said connection points, and said fourth conductor includes a portion extending in spaced parallel relation with the opposite section of said gap in said ground plane means and terminating near said connection points and spaced from said third conductor.

17. The invention according to claim 16 comprising a first jumper connected between one of said stubs and the ground plane across the gap therefrom, and a second jumper connected between the other of said stubs and the ground plane across the gap therefrom.

18. A balun coupled frequency converter comprising in combination:
a dielectric substrate of low relative dielectric constant substantially less than 9, unsuitable for slotline transmission;
ground plane means on said substrate;
first and second conductors on said substrate extending from said ground plane means toward a common area;
a transmission line of said substrate juxtaposed said first and second conductors for interacting therewith to balun couple a field balanced between said first and second conductors across said common area;
third and fourth conductors on said substrate adjacent said common area; and
a diode mixer bridge having two pairs of diodes interconnecting said conductors for heterodyne modulation product signal generation.

19. The invention according to claim 18 wherein said first and second conductors are spaced by a gap across said common area of width substantially greater than 10 mils.

20. The invention according to claim 19 wherein said converter is fabricated on a printed circuit board comprising a metal clad said dielectric substrate etched to provide a microstrip pattern forming said ground plane means, said first, second, third and fourth conductors, and said transmission line.

21. The invention according to claim 18 wherein said gap width is about 40 mils, and said relative dielectric constant is about 2 to 5.

22. A balun coupled frequency converter comprising in combination:
a dielectric planar substrate;
ground plane means on said substrate;
first and second microstrip conductors on one planar side of said substrate and extending from said ground plane means toward a common area;
an input microstrip transmission line on the other planar side of said substrate and juxtaposed said first and second stripline conductors for interacting therewith to balun couple a field between balanced said first and second conductors across said common area;
third and fourth spaced microstrip conductors on said substrate adjacent said common area; and
a diode mixer bridge having two pairs of diodes interconnecting said conductors for heterodyne modulation product signal generation.

23. The invention according to claim 22 wherein said third and fourth conductors are each unbalanced.

24. The invention according to claim 23 wherein said third and fourth conductors are on said one side of said substrate.

25. The invention according to claim 23 wherein said third and fourth conductors are on said other side of said substrate.

26. A balun coupled frequency converter comprising in combination:
 ground plane means;
 first and second RF conductors extending from said ground plane means toward a common area;
 an input RF transmission line juxtaposed said first and second RF conductors for interacting therewith to generate a field between balanced said first and second RF conductors across said common area;
 input LO signal means including first and second spaced LO conductors adjacent said common area; and
 a diode mixer bridge having two pairs of diodes interconnecting said first and second RF and LO conductors for generating an IF signal and circulating image frequencies in the bridge to return image frequency power to the diodes to reduce conversion loss from RF to IF.

27. The invention according to claim 26 wherein said bridge is connected to said RF conductors at a single point on each to provide zero connection length between the diode pairs to prevent a phase shift between the image frequencies in the pairs.

28. The invention according to claim 27 wherein said first and second LO conductors are each unbalanced, and further comprising means setting said single RF conductor connection points at substantially the same potential reference level relative to LO signals on said LO conductors such that no net potential is induced between said RF conductors from either of said LO conductors whereby to isolate LO signals from said RF conductors.

29. The invention according to claim 28 wherein said last mentioned means further provides at each said single RF conductor connection point a low impedance effective ground relative to LO signals on said LO conductors such that LO signals on said first LO conductor are isolated from said second LO conductor, and LO signals on said second LO conductor are isolated from LO signals on said first LO conductor.

30. The invention according to claim 29 comprising a first stub extending from said connection point on said first RF conductor one-quarter RF frequency wavelength to an open-circuited end non-connected to said ground plane means, and a second stub extending from said connection point on said second RF conductor one-quarter RF frequency wavelength to an open-circuited end non-connected to said ground plane means.

31. The invention according to claim 30 wherein said first and second RF conductors each have a length of one-quarter RF frequency wavelength between said ground plane means and its respective said connection point, and wherein said first and second stubs extend away from said connection points on the opposite side thereof from said LO conductors.

32. The invention according to claim 30 wherein said first and second stubs diverge from said connection points on the same side thereof as said LO conductors.

33. The invention according to claim 32 wherein said first and second RF conductors include first portions extending toward each other from said ground plane means and second extension portions extending parallel to each other to meet said first and second stubs at said connection points.

34. The invention according to claim 29 wherein each of said RF conductors has a pair of stubs diverging therefrom with the first stub of each pair juxtaposed said first LO conductor and the second stub of each pair juxtaposed said said second LO conductor such that said first LO conductor sees the same potential reference to each of said first stubs and induces no net potential difference thereacross, and said second LO conductor sees the same potential reference to each of said second stubs and induces no net potential difference thereacross whereby the LO signals on said LO conductors are isolated from said RF conductors.

35. The invention according to claim 34 wherein:
 said first stubs extend in spaced parallel relation from respective said RF conductor connection points to said ground plane means;
 said second stubs extend oppositely from said first stubs and in spaced parallel relation from respective said RF conductor connection points to said ground plane means;
 one of the stubs has jumper means for crossing over in spaced relation a stub of the other pair to prevent connection therebetween;
 said first LO conductor includes a portion extending in spaced parallel relation with said first stubs and terminating near said RF conductor connection points; and
 said second LO conductor includes a portion extending in spaced parallel relation with said second stubs and terminating near said RF conductor connection points and spaced from said first LO conductor.

36. The invention according to claim 29 wherein each of said first and second RF conductors has a wide stub extending from its said RF conductor connection point to said ground plane means and juxtaposed a respective one of said first and second LO conductors to prevent induction of LO signals from said LO conductor to said RF conductor by presenting an effective ground suppressing such induction whereby to isolate LO signals from said RF conductors and from the other LO conductor.

37. The invention according to claim 36 wherein said RF conductors have first portions extending toward each other from said ground plane means and second extension portions extending parallel to each other to meet said stubs at said RF conductor connection points, said stubs extending from said RF conductor connection points to said ground plane means,
 and wherein said first LO conductor includes a portion extending in spaced parallel relation with one of said stubs and terminating near said RF conductor connection points, and said second LO conductor includes a portion extending in spaced parallel relation with the other of said stubs and terminating near said RF conductor connection points and spaced from said first LO conductor.

38. The invention according to claim 37 wherein said stubs extend in opposite directions from said RF conductor connection points and are divergently tapered at their root ends adjacent to said RF conductor connection points.

39. The invention according to claim 29 comprising a gap in said ground plane means adjacent said RF conductor connection points and juxtaposed said first and second LO conductors to suppress LO signal induction therefrom.

40. The invention according to claim 39 wherein said RF conductors have first portions extending toward each other from said ground plane means and second extension portions extending in spaced parallel relation to said RF conductor connection points and defining said common area as a gap therebetween, said gap in said ground plane means diverging from said common area adjacent said RF conductor connection points to define oppositely extending stubs from respective said RF conductor connection points to said ground plane means, and wherein said first LO conductor includes a portion extending in spaced parallel relation with a section of said gap in said ground plane means and terminating near said RF conductor connection points, and said second LO conductor includes a portion extending in spaced parallel relation with the opposite section of said gap in said ground plane means and terminating near said RF conductor connection points and spaced from said first LO conductor.

41. The invention according to claim 40 comprising a first jumper connected between one of said stubs and the ground plane across the gap therefrom, and a second jumper connected between the other of said stubs and the ground plane across the gap therefrom, to set each side of said gap in said ground plane means at the same reference potential.

42. A balun coupled frequency converter comprising in combination:

a dielectric substrate of low relative dielectric constant substantially less than 9, unsuitable for slot line transmission;

ground plane means on said substrate;

first and second RF conductors on said substrate extending from said ground plane means toward a common area;

an input RF transmission line on said substrate juxtaposed said first and second RF conductors for interacting therefrom to generate a field between balanced said first and second RF conductors across said common area;

input LO signal means including first and second spaced LO conductors on said substrate adjacent said common area; and a diode mixer bridge having two pairs of diodes interconnecting said first and second RF and LO conductors for generating an IF signal and circulating image frequencies in the bridge to return image frequency power to the diodes to reduce conversion loss from RF to IF.

43. A balun coupled frequency converter comprising in combination:

ground plane means;

first and second LO conductors extending from said ground plane means toward a common area;

an input LO transmission line juxtaposed said first and second LO conductors for interacting therewith to generate a field between balanced first and second LO conductors across said common area;

input RF signal means includng first and second spaced RF conductors adjacent said common area; and a diode mixer bridge having two pairs of diodes interconnecting said first and second LO and RF conductors for generating an IF signal, and for generating noncanceled image frequencies on said input RF signal means.

44. The invention according to claim 43 wherein said first and second RF conductors are each unbalanced, and further comprising means setting the LO conductor connection points of said diodes at substantially the same potential reference level relative to RF signals on said RF conductors such that no net potential is induced between said LO conductors from either of said RF conductors whereby to isolate RF signals from said LO conductors.

45. The invention according to claim 44 wherein said last mentioned means further provides at each said LO conductor connection point a low impedance effective ground relative to RF signals on said RF conductors such that RF signals on said first RF conductor are isolated from said second RF conductor, and RF signals on said second RF conductor are isolated from RF signals on said first RF conductor.

* * * * *